United States Patent
Sheu et al.

(12)

(10) Patent No.: US 7,242,174 B1
(45) Date of Patent: Jul. 10, 2007

(54) DIGITAL SENSING CIRCUIT

(75) Inventors: Shyh-Shyuan Sheu, Taichung (TW); Wei-Jen Chang, Tainan (TW); Jan-Ruei Lin, Taipei County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/309,002

(22) Filed: Jun. 7, 2006

(30) Foreign Application Priority Data

Dec. 30, 2005 (TW) .............................. 94147727 A

(51) Int. Cl.
G01R 19/00 (2006.01)
G11C 7/00 (2006.01)
(52) U.S. Cl. .................. 324/76.11; 365/189.01
(58) Field of Classification Search ............. 324/76.11; 365/189.01
See application file for complete search history.

(56) References Cited

U.S. PATENT DOCUMENTS

| 6,965,521 | B2 * | 11/2005 | Li et al. ...................... 365/148 |
| 2004/0001383 | A1 * | 1/2004 | Garni et al. ................. 365/209 |
| 2006/0044907 | A1 * | 3/2006 | Forbes et al. ............... 365/207 |

* cited by examiner

*Primary Examiner*—Andrew H. Hirshfeld
*Assistant Examiner*—Amy He
(74) *Attorney, Agent, or Firm*—Jianq Chyun IP Office

(57) ABSTRACT

A digital sensing circuit capable of sensing bit information stored in a bit cell of an organic memory is provided. The digital sensing circuit includes a current-to-voltage converter, a reset block circuit, and a sensing block circuit. The current-to-voltage converter converts a conduction current into a voltage signal. The sensing block circuit buffers and outputs the bit information according to the voltage signal. Therefore, the challenge of design and layout of the present invention is very low so that the yield rate will be improved. Hence, a practical memory device suitable for mass-production is achieved.

19 Claims, 6 Drawing Sheets

DIGITAL SENSING CIRCUIT

CROSS-REFERENCE TO RELATED APPLICATION

This application claims the priority benefit of Taiwan application serial no. 94147727, filed on Dec. 30, 2005. All disclosure of the Taiwan application is incorporated herein by reference.

BACKGROUND OF THE INVENTION

1. Field of Invention

The present invention relates to a sensing circuit in a memory, and more particularly, to a digital sensing circuit in a multi-stable memory device.

2. Description of Related Art

In recent years, bistable materials are often used in the fabrication of memory devices, switching devices and so on. The bistable material comprises an inorganic and an organic material. Furthermore, the bistable material can switch between a high and a low resistance state according to the applied voltage. It should be noted that a multi-state memory device could be produced when this type of bistable organic material is disposed between two electrodes and the multi-state memory device has great potential to become the next generation of non-volatile memory.

Compared with a silicon-based device, an organic device fabricated from an organic material has the advantages of a better extensibility and bending capacity. Because the organic material can be coated on virtually any types of surfaces, the idea of forming an organic memory array on a flexible plastic substrate can be realized. Furthermore, the organic material can be fabricated and processed after all the silicon processes have been completed so that the entire processing operation is simplified. Due to the aforementioned advantages and properties, many types of printing manufacturing processes are likely to be developed for mass-producing the organic devices, thereby substantially reducing the production cost of the device and widening its applications.

FIG. 1 is a graph showing the ideal operating curve of an organic memory cell inside an organic memory. The organic memory cell is fabricated using an organic material. As shown in FIG. 1, the organic memory cell has at least a bistable characteristic. That is, the organic memory cell can station in a high resistance state or a low resistance state. When the organic memory cell is in a high resistance state, the relation between the conduction current and the biased voltage follows the indicated path 110. Thus, if a biased voltage $V_R$ is applied to the organic memory cell when the organic memory cell is in the high resistance state, then the conduction current flowing through the organic memory cell will be $I_0$. When the applied biased voltage exceeds $V_{T1}$, the organic memory cell will change from a high resistance state to a low resistance state. Thereafter, the relation between the biased voltage and the conduction current will follow the path 120. Hence, if the applied biased voltage is $V_R$ when the organic memory cell is in the low resistance state, then the conduction current flowing through the organic memory cell is $I_1$, where $I_1 >> I_0$. After that, if the applied biased voltage is lower than VT0, then the organic memory cell will revert from a low resistance state back to a high resistance state. It should be noted, however, that the characteristic curve in FIG. 1 is highly idealized. In general, if a different organic material is used in the organic memory cell, the characteristic curve may differ slightly. Yet, all in all, the basic characteristics of the organic memory do not change considerably from the ideal characteristic curve shown in FIG. 1.

Accordingly, a memory fabricated using a bistable organic material can have a greater bending capability such that it can be used in an elastic and bendable system with flexible electronic devices. More specifically, the organic memory has a low production cost so that it can become one of the most important electronic memory devices in the world. Hence, there is an urgent need for developing a practical and complete organic memory. In particular, it is extremely important to develop a digital sensing circuit with simple design and layout, high yield rate, and easy production.

SUMMARY OF THE INVENTION

The present invention provides a digital sensing circuit capable of sensing bit information stored in a bit cell of an organic memory. The digital sensing circuit is quite simple, such that the challenge of layout and design is very low and the yield rate will be improved. It is suitable for being used in the LTPS process; thereby a practical memory device suitable for mass-production is achieved.

The present invention provides a digital sensing circuit capable of sensing bit information stored in a bit cell of one of a phase-change memory and a magnetic memory. The digital sensing circuit has a simple design and high yield rate, such that a practical memory device suitable for mass-production is achieved.

From one point of view, the present invention provides a digital sensing circuit capable of sensing bit information stored in a bit cell of an organic memory. The digital sensing circuit at least comprises a current-to-voltage converter and a sensing block circuit. The current-to-voltage converter has a current terminal. According to a conduction current flowing through the current terminal, the current-to-voltage converter converts the conduction current into a voltage signal. The sensing block circuit is coupled to the current-to-voltage converter and receives the voltage signal, and buffers and outputs the bit information stored in the bit cell of the organic memory according to the voltage signal.

According to the embodiments of the present invention, the above digital sensing circuit can further include a reset block circuit coupled to the current-to-voltage converter, which can be used to reset the voltage signal according to a first switch signal.

According to the embodiments of the present invention, the current-to-voltage converter of the digital sensing circuit includes a first transistor and a capacitor, wherein the capacitor has a first terminal and a second terminal. A first source/drain of the first transistor is connected to the current terminal of the current-to-voltage converter; a gate of the first transistor is connected to a second switch signal; a first terminal of the capacitor is connected to a second source/drain of the first transistor; a second terminal of the capacitor is connected to a first potential; and the voltage signal is obtained via the first terminal of the capacitor. In addition, the above reset block circuit includes a second transistor. A first source/drain of the second transistor is connected to the first terminal of the capacitor; a second source/drain of the second transistor is connected to a second potential; a gate of the second transistor is connected to the first switch signal. When the first transistor is conducted, the second transistor is not conducted; and when the first transistor is not conducted, the second transistor is conducted. For example, if the type of the first transistor is different from that of the second transistor, the first switch signal is the same as the second switch signal. If the type of the first transistor is the same as that of the second transistor, the second switch signal is out of phase with the first switch signal. More particularly, for example, the first and second switch signals can be clock signals, and then the digital sensing circuit utilizes the duty cycles of the clock signals to adjust individual conducting time of the first and second transistors. In the embodiments, the above first and second transistors are, for example, ground potentials.

According to the embodiments of the present invention, the sensing block circuit of the above digital sensing circuit at least includes a third transistor and a fourth transistor. A first source/drain of the third transistor is connected to a third potential; a gate of the third transistor is connected to a third switch signal; and a first source/drain of the fourth transistor is connected to a second source/drain of the third transistor; a second source/drain of the fourth transistor is connected to the first potential; a gate of the fourth transistor is connected to the voltage signal. When the third transistor is not conducted, the first source/drain of the fourth transistor outputs the bit information stored in the bit cell of the organic memory. In the embodiments, the sensing block circuit of the above digital sensing circuit further includes a fifth transistor and a sixth transistor. A first source/drain of the fifth transistor is connected to a third potential; a gate of the fifth transistor is connected to the first source/drain of the fourth transistor; and a first source/drain of the sixth transistor is connected to a second source/drain of the fifth transistor; a second source/drain of the sixth transistor is connected to the first potential; a gate of the sixth transistor is connected to the gate of the fifth transistor. The type of the fifth transistor is different from that of the sixth transistor, and the bit information stored in the bit cell of the organic memory is output via the first source/drain of the sixth transistor. For example, the fifth transistor is a P-type transistor, and the sixth transistor is an N-type transistor. In the embodiments, the first potential is, for example, a ground potential, and the third potential is, for example, a power-source potential.

According to the embodiments of the present invention, the above digital sensing circuit further connects to a sample and hold circuit that shapes and outputs the bit information stored in the bit cell of the organic memory.

It should be noted that the organic memory with the digital sensing circuit of the present invention can be applied as a non-volatile memory.

From another point of view, the digital sensing circuit provided by the present invention is not limited to be applied in the organic memory, and other memories, such as, the phase-change memory (PCRAM) or the magnetic memory (MRAM) also can utilize the same digital sensing circuit to detect the bit information stored in the bit cell of the digital sensing circuit.

To sum up, the digital sensing circuit provided by the present invention only simply includes a current-to-voltage converter, a reset block circuit, and a sensing block circuit, such that the challenge of layout and design is very low, and the yield rate will be improved. In addition, it is suitable for being used in the LTPS process. Hence, a practical memory device suitable for mass-production is achieved.

In order to make the aforementioned and other objects, features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
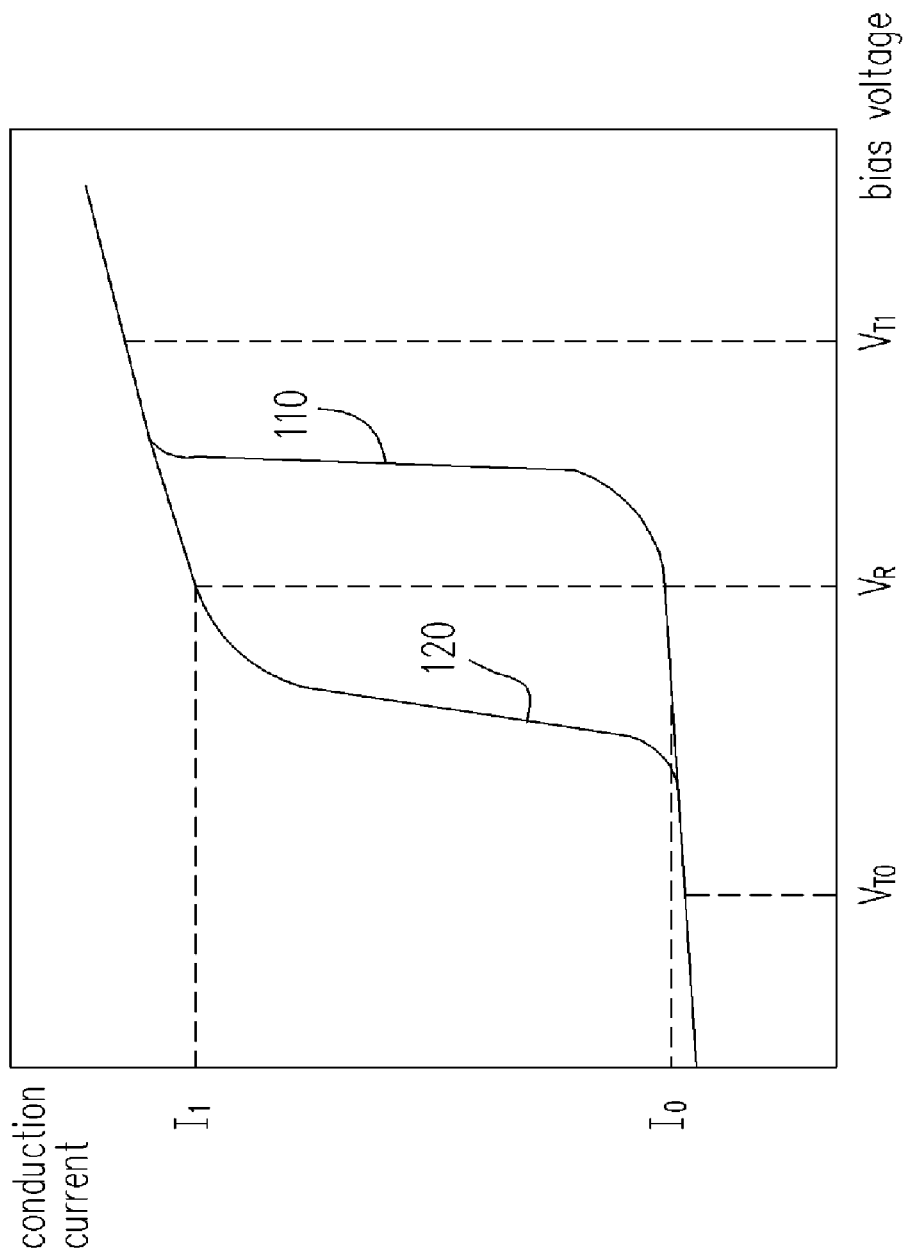
FIG. 1 is a graph showing the ideal operating curve of an organic memory cell inside an organic memory.
Figure 2:
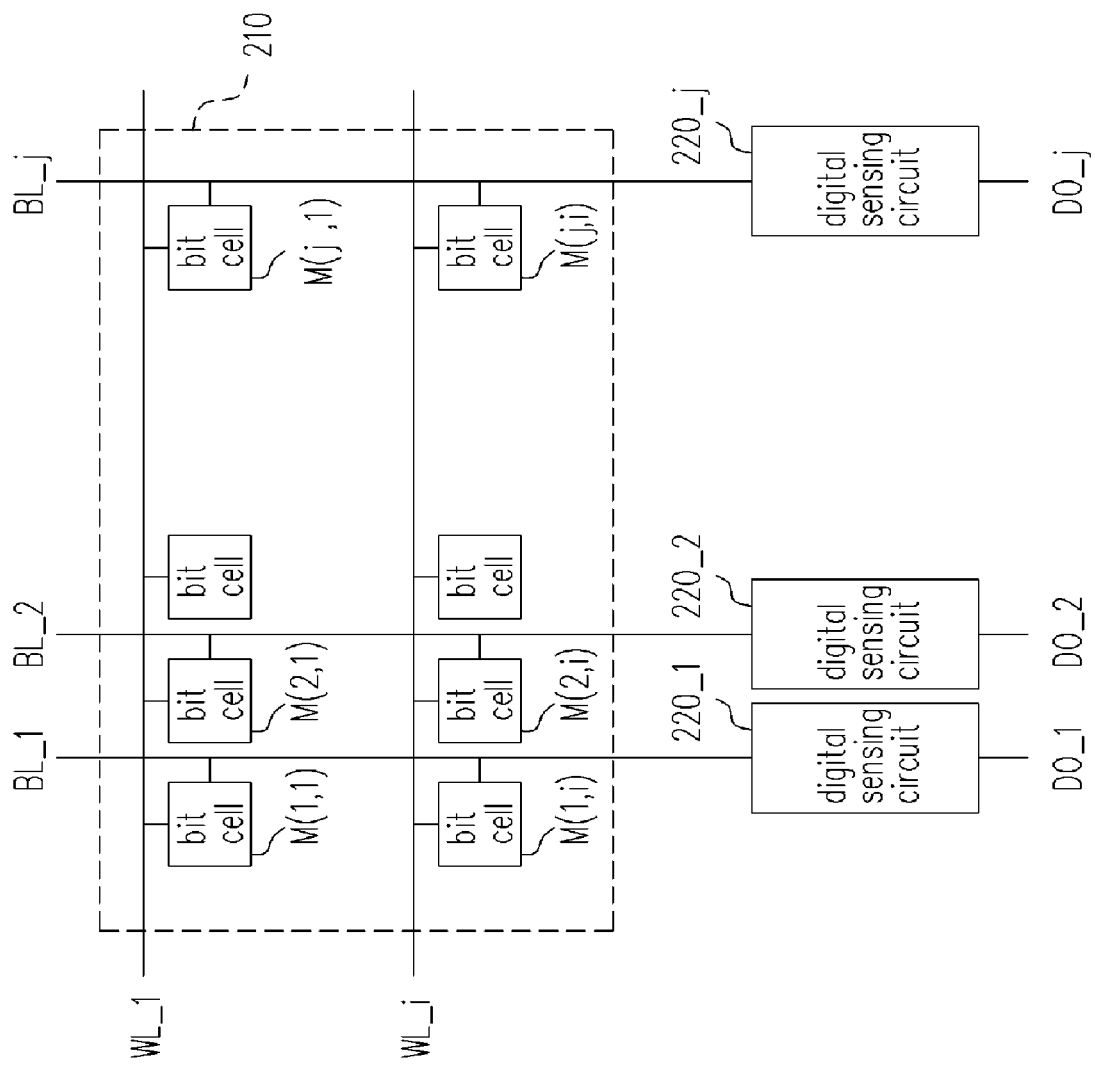
FIG. 2 is a circuit block diagram of an organic memory with the digital sensing circuit of the present invention.

FIG. 2 is a circuit block diagram of an organic memory with the digital sensing circuit of the present invention. Referring to FIG. 2, the organic memory includes: i select lines WL_1, . . . , WL_i, j data lines BL_1, BL_2, . . . , BL_j, a bit cell array 210, and j digital sensing circuits 220_1, 220_2, . . . , 220_j. The bit cell array 210 includes a plurality of bit cells M(1,1), M(2,1), . . . , M(j,1), . . . , M(1,i), M(2,i), . . . , M(j,i). As can be known from the figure, there must be at least one of these bit cells connecting between each data line and each select line. Each digital sensing circuit 220_1, 220_2, . . . , 220_j respectively connects to the corresponding data line BL_1, BL_2, . . . , BL_j. In order to explain more clearly, the bit cell row B(n) is defined as all of the bit cells M(1,n), M(2,n), . . . , M(j,n) connected to the $n^{th}$ select line; the bit cell M(m,n) is defined as the bit cell connected to the $m^{th}$ data line and the $n^{th}$ select line, where the above i, j, m, n are positive integers (natural number) that are greater than 0, and n<=i, m<=j.

Figure 3:
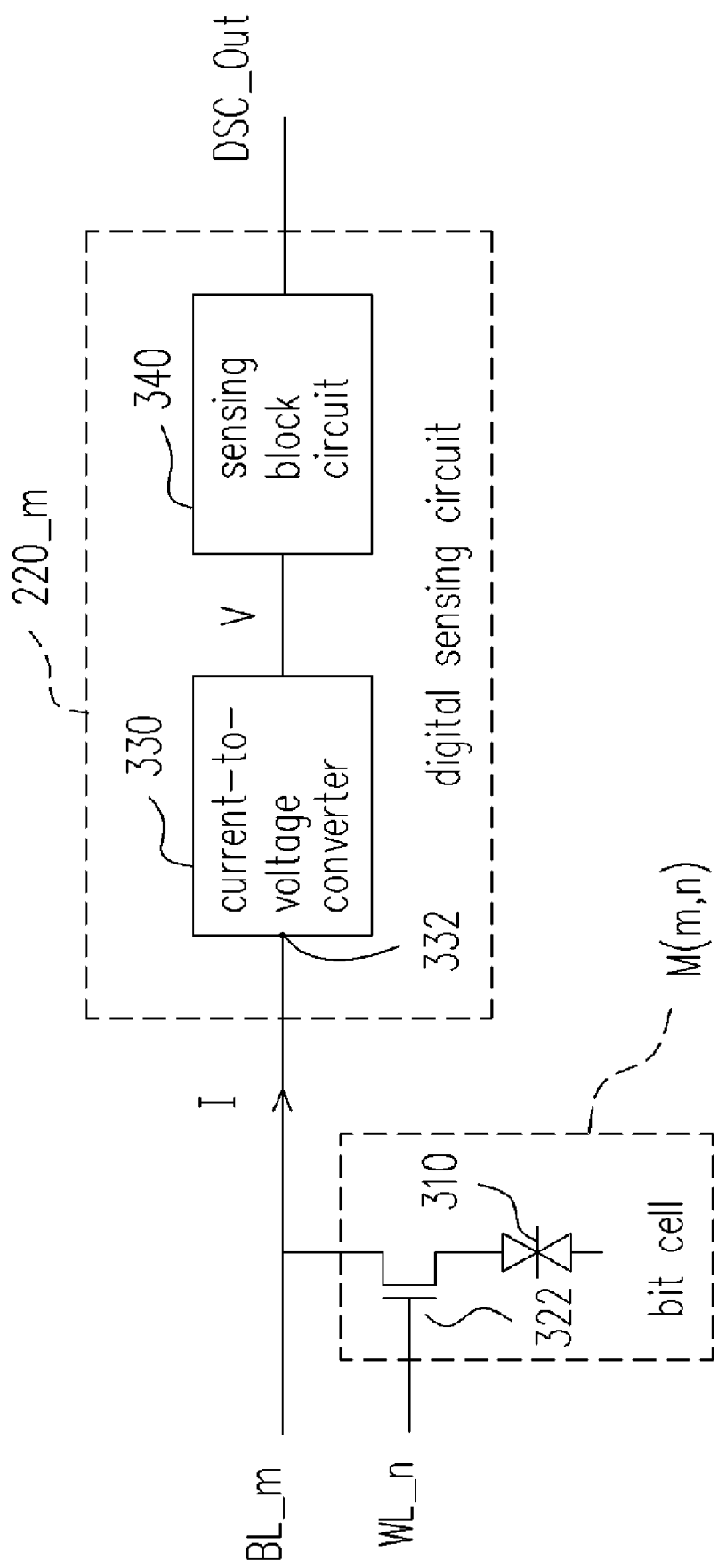
FIG. 3 is a circuit block diagram of a digital sensing circuit according to one embodiment of the present invention.

FIG. 3 is a circuit block diagram of a digital sensing circuit according to one embodiment of the present invention. Referring to FIG. 3, the digital sensing circuit 220_m provided by the present invention is used to sense the bit information stored in the bit cell M(m,n) of the organic memory. The digital sensing circuit 220_m at least includes a current-to-voltage converter 330 and a sensing block circuit 340. The current-to-voltage converter 330 has a current terminal 332. According to a conduction current I flowing through the current terminal 332, the current-to-voltage converter 330 converts the conduction current I into a voltage signal V. The sensing block circuit 340 is coupled to the current-to-voltage converter 330 and receives the voltage signal V output by the current-to-voltage converter 330, so as to buffer and output the bit information stored in the bit cell M(m,n) of the organic memory according to the voltage signal V.

The bit cell M(m,n) at least includes an organic memory cell 310 and a transistor 322. The organic memory cell 310 is, for example, a multi-stable memory device manufactured by disposing the organic material between the two electrodes. Therefore, the organic memory cell can be used to store the bit information. Of course, an organic memory cell is not limited to only storing one-bit information. When the signal on the select line WL_n is enabled, such that the transistor 322 is conducted, the organic memory cell 310 will be connected to the data line BL_m. Since when the organic memory cell 310 is in the low impedance state or the high impedance state, the magnitude difference of the conduction currents flowing through the organic memory cell 310 is extremely great, the digital sensing circuit 220_m can sense the bit information stored in the bit cell M(m,n) of the organic memory according to the conduction current I flowing through the current terminal 332.

Referring to FIGS. 2 and 3, when the $n^{th}$ select line is enabled, the transistor in the bit cell row B(n) will connect the organic memory cell in the bit cell row B(n) to the respective data line. These digital sensing circuits 220_1, 220_2, . . . , 220_j can sense and read the bit information stored in the organic memory cell of the bit cell row B(n) through the respective connected data lines BL_1, BL_2, . . . , BL_j.

Figure 4A:
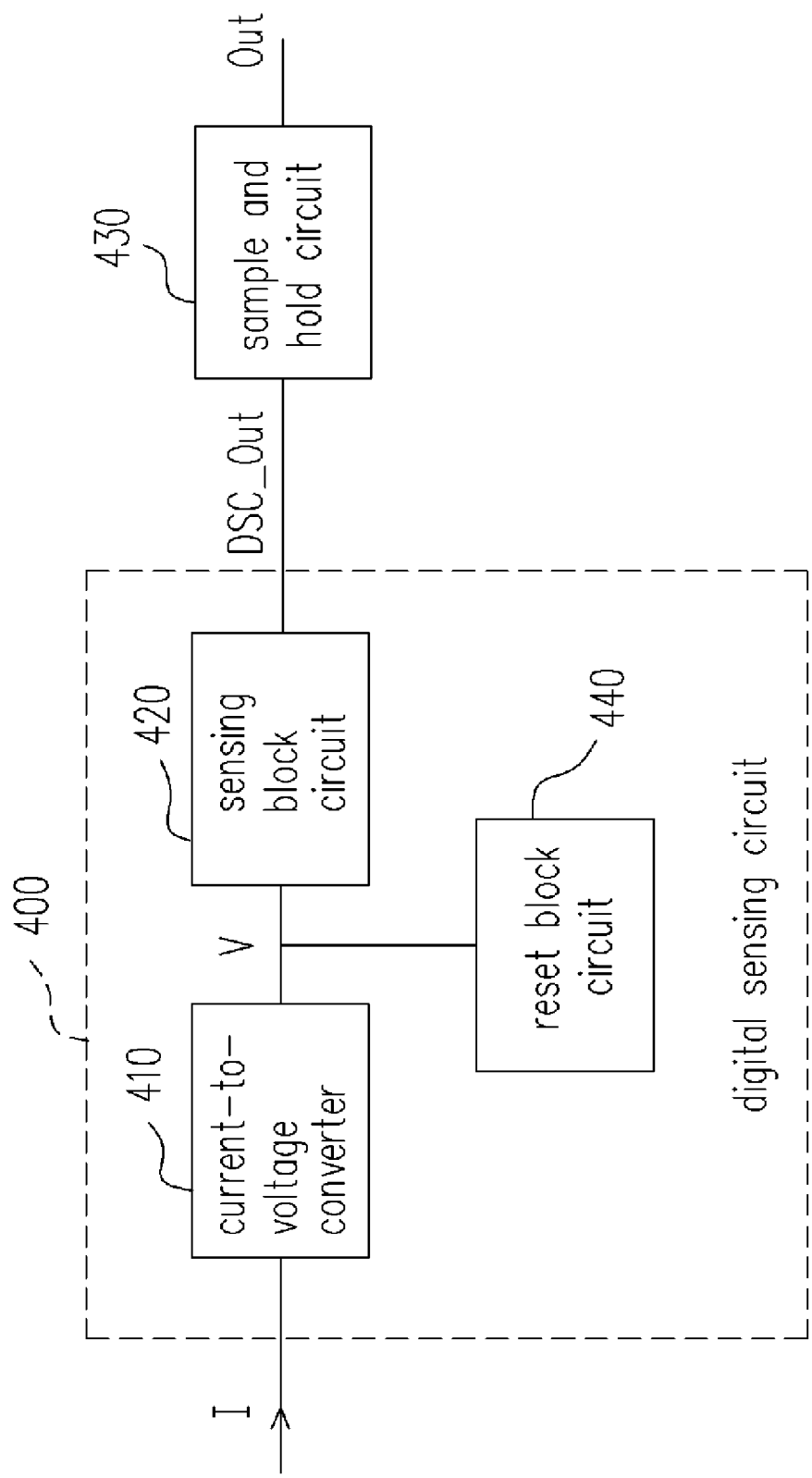
FIG. 4A is a circuit block diagram of a digital sensing circuit according to another embodiment of the present invention.

FIG. 4A is a circuit block diagram of a digital sensing circuit according to another embodiment of the present invention. Referring to FIG. 4A, the digital sensing circuit 400 of the present embodiment includes a current-to-voltage converter 410 and a sensing block circuit 420; and a reset block circuit 440 coupled to the current-to-voltage converter 410 is further included. The functions of the current-to-voltage converter 410 and the sensing block circuit 420 are the same as that described in FIG. 3. The newly-added reset block circuit 440 is used to reset the voltage signal V in the current-to-voltage converter 410 according to a first switch signal (not shown). In the embodiment, the digital sensing circuit 400 is further connected to a sample and hold circuit 430 that is used to shape and then output the output of the sensing block circuit 420, i.e., the sample and hold circuit 430 is used to shape and output the bit information stored in the bit cell of the organic memory.

Figure 4B:
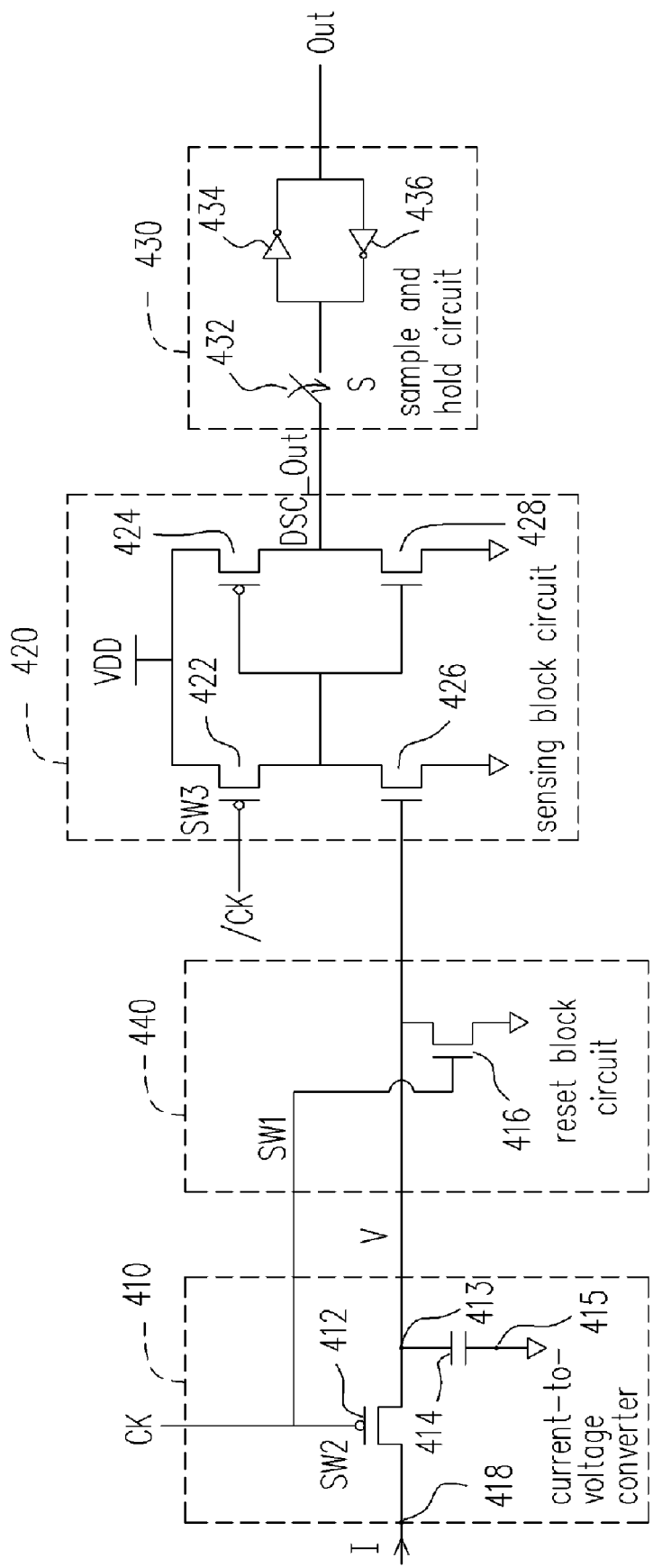
FIG. 4B is a circuit diagram of one embodiment of the digital sensing circuit of FIG. 4A.

FIG. 4B is a circuit diagram of one embodiment of the digital sensing circuit of FIG. 4A. Referring to FIG. 4B, the current-to-voltage converter 410 of the digital sensing circuit includes a first transistor 412 and a capacitor 414, wherein the capacitor 414 has a first terminal 413 and a second terminal 415. A first source/drain of the first transistor 412 is connected to the current terminal 418 of the current-to-voltage converter 410; a gate of the first transistor 412 is connected to a second switch signal SW2; a first terminal 413 of the capacitor 414 is connected to a second source/drain of the first transistor 412; a second terminal 415 of the capacitor 414 is connected to a first potential, for example, a ground potential; and the voltage signal V is obtained via the first terminal 413 of the capacitor 414. In the embodiment, the reset block circuit 440 only includes a second transistor 416. A first source/drain of the second transistor 416 is connected to the first terminal 413 of the capacitor 414; a second source/drain of the second transistor 416 is connected to a second potential, for example, a ground potential; and a gate of the second transistor 416 is connected to the first switch signal SW1.

The principle for the normal operation of the circuit is that: when the first transistor 412 is conducted, the capacitor 414 in the current-to-voltage converter 410 quickly or slowly changes the voltage signal V according to the magnitude of the conduction current I, thus, the second transistor must not be conducted. When the second transistor 416 in the reset block circuit 440 is conducted, the first terminal 413 of the capacitor 414 is forced to be reset to the second potential, ground potential in this embodiment, such that the first transistor 412 must not be conducted. Therefore, if the type of the first transistor 412 is different from that of the second transistor 416, the first switch signal SW1 is the same as the second switch signal SW2. Otherwise, if the type of the first transistor 412 is the same as that of the second transistor 416, the second switch signal SW2 is out of phase with the first switch signal SW1. In the present embodiment, since the type of the first transistor 412 is different from that of the second transistor 416, particularly the first switch signal SW1 and the second switch signal SW2 are meanwhile clock signals CK. Then, the digital sensing circuit of the present embodiment adjusts the duty cycle of the clock signal CK, so as to adjust the individual conducting time of the first transistor 412 and the second transistor 416. If the electrical characteristics drift, e.g., changes of the current magnitude occurred in the organic memory of the present invention in the manufacturing process, the duty cycle of the clock signal CK can be adjusted to enable the output of the digital sensing circuit with the same characteristics.

Again, Referring to FIG. 4B, the sensing block circuit 420 of the digital sensing circuit at least includes a third transistor 422 and a fourth transistor 426. A first source/drain of the third transistor 422 is connected to a third potential, for example, a power-source potential VDD; a gate of the third transistor 422 is connected to a third switch signal SW3; and a first source/drain of the fourth transistor 426 is connected to a second source/drain of the third transistor 422; a second source/drain of the fourth transistor 426 is connected to the first potential, for example, a ground potential; and a gate of the fourth transistor 426 is connected to the voltage signal V output by the current-to-voltage converter 410. As can be known from the figure, the principle for the normal operation of the above circuit is that: when the third transistor 422 is not conducted, the fourth transistor 426 outputs the bit information stored in the bit cell of the organic memory via its first source/drain according to the voltage signal V, such that the first transistor 412 must be conducted. Otherwise, when the third transistor 422 is conducted, the first source/drain of the fourth transistor 426 is connected to the third potential, power-source potential VDD in this embodiment, such that it is impossible to sense the bit information. Therefore, in the present embodiment, since the type of the third transistor 422 is the same as that of the first transistor 412, the third switch SW3 must be out of phase with the first switch signal SW1; thus, when the first transistor 412 is conducted, the third transistor 422 is not conducted. Therefore, in the present embodiment, the third switch signal SW3 is particularly the reversed signal /CK of the clock signal.

In the present embodiment, the sensing block circuit 420 of the digital sensing circuit further includes a push-pull circuit consisting of a fifth transistor 424 and a sixth transistor 428. A first source/drain of the fifth transistor 424 is connected to a third potential, for example, a power-source potential VDD; a gate of the fifth transistor 424 is connected to the first source/drain of the fourth transistor 426; and a first source/drain of the sixth transistor 428 is connected to a second source/drain of the fifth transistor 424; a second source/drain of the sixth transistor 428 is connected to the first potential, for example, a ground potential; and a gate of the sixth transistor 428 is connected to the gate of the fifth transistor 424. The type of the fifth transistor 424 is different from that of the sixth transistor 428, and the bit information stored in the bit cell of the organic memory is output via the first source/drain of the sixth transistor 428. In the present embodiment, the fifth transistor is, for example, a P-type transistor and the sixth transistor is, for example, an N-type transistor.

In the present embodiment, the sample and hold circuit 430 includes: a switch 432 and a latch formed by an inverter 434 and an inverter 436. When the first transistor 412 is conducted, the switch 432 connects a Dsc_Out signal to the latch formed by an inverter 434 and an inverter 436 according to a sampling signal S, so as to shape and output the bit information stored in the organic memory cell.

Figure 5:
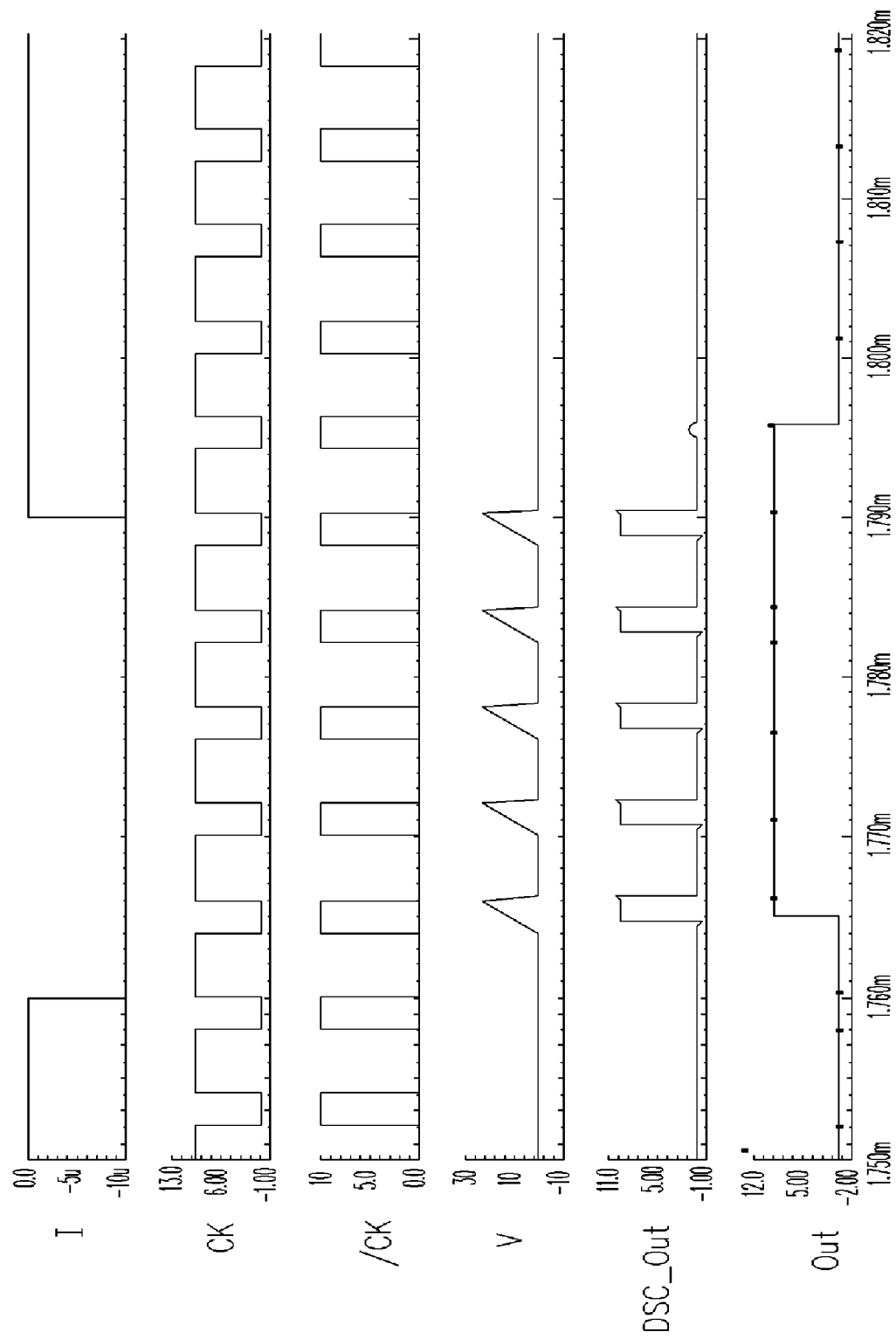
FIG. 5 is a timing chart of each signal of the digital sensing circuit of FIG. 4B.

FIG. 5 is a timing chart of each signal of the digital sensing circuit of FIG. 4B. Referring to FIGS. 4B and 5, as can be known from the figure, the first transistor 412 is, for example, a P-type transistor and the second transistor 416 is, for example, an N-type transistor. Thus, when the clock signal CK is in the half-period of high potential, the first transistor 412 is not conducted and the second transistor 416 is conducted, and meanwhile the capacitor 414 is reset to the ground potential, such that the voltage signal V is maintained at the low (ground) potential. Then, when the clock signal CK is in the half-period of low potential, the first transistor 412 is conducted and the second transistor 416 is not conducted, and meanwhile a conduction current I flowing via the current terminal 418 charges the capacitor 414. Since the conduction current used for charging has some relationship with the state of the organic memory cell, that is, the stored bit information, the conduction current when the organic memory cell is in the low impedance state is much greater than the conduction current when the organic memory cell is in the high impedance state. Thus, when the organic memory cell is in the low impedance state, the capacitor 414 is charged quickly; the voltage signal V rapidly rises to exceed the critical potential for conducting the transistor 416, such that the fourth transistor 426 is conducted, and the Dsc_Out signal becomes the high potential. Oppositely, when the organic memory cell is in the high impedance state, the capacitor 414 is charged slowly; the voltage signal maintains at the low potential nearly without any change, such that the fourth transistor 426 maintains un-conducted, and the Dsc_Out signal maintains at the low potential. Therefore, at this time, the Dsc_Out signal can represent the bit information stored in the organic memory cell. The sample and hold circuit 430 shapes the Dsc_Out signal into the one that will not change along with the half-period according to the sampling signal S, and outputs the output signal Out purely representing the bit information stored in the organic memory cell.

Since organic material will not change its state with the disappearance of the bias voltage, the organic memory with the digital sensing circuit of the present invention can be applied as a non-volatile memory.

From another point of view, a digital sensing circuit provided in the present invention is not limited to be only used in an organic memory, and other memories, such as the PCRAM and the MRAM also can utilize the same digital sensing circuit mentioned in the above embodiments to detect the bit information stored in the bit cell of the memories.

In summary, the digital sensing circuit provided by the present invention only simply includes a current-to-voltage converter, a reset block circuit, and a sensing block circuit, such that the challenge of layout and design is very low, and the yield rate will be improved, and it is suitable for being used in the LTPS process. Hence, a practical memory device suitable for mass-production is achieved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A digital sensing circuit used for sensing bit information stored in a bit cell of an organic memory, comprising:
   a current-to-voltage converter, having a current terminal, used to convert a conduction current flowing through the current terminal into a voltage signal according to the conduction current;
   a sensing block circuit, coupled to the current-to-voltage converter and used to receive the voltage signal, so as to buffer and output the bit information stored in the bit cell according to the voltage signal; and
   a reset block circuit coupled to the current-to-voltage converter, wherein the reset block circuit is used to reset the voltage signal according to a first switch signal; and
   wherein the current-to-voltage converter comprises:
   a first transistor, with a first source/drain of the first transistor being connected to the current terminal of the current-to-voltage converter, with a gate of the first transistor being connected to a second switch signal; and
   a capacitor, with a first terminal and a second terminal, wherein the first terminal is connected to a second source/drain of the first transistor; the second terminal is connected to a first potential; and the voltage signal is obtained via the first terminal;
   wherein the reset block circuit comprises:
   a second transistor, with a first source/drain of the second transistor being connected to the first terminal of the capacitor, with a second source/drain of the second transistor being connected to a second potential, with a gate of the second transistor being connected to the first switch signal,
   wherein, when the first transistor is conducted, the second transistor is not conducted; and when the first transistor is not conducted, the second transistor is conducted.

2. The digital sensing circuit as claimed in claim 1, wherein if the type of the first transistor is different from that of the second transistor, the first switch signal is the same as the second switch signal; if the type of the first transistor is the same as that of the second transistor, the second switch signal is out of phase with the first switch signal.

3. The digital sensing circuit as claimed in claim 2, wherein the first switch signal and the second switch signal are a clock signal, and the digital sensing circuit utilizes the duty cycle of the clock signal to adjust individual conducting time of the first transistor and the second transistor.

4. The digital sensing circuit as claimed in claim 1, wherein the first potential and the second potential both are ground potentials.

5. The digital sensing circuit as claimed in claim 1, wherein the sensing block circuit comprises:
   a third transistor, with a first source/drain of the third transistor being connected to a third potential, with a gate of the third transistor being connected to a third switch signal; and
   a fourth transistor, with a first source/drain of the fourth transistor being connected to a second source/drain of the third transistor, with a second source/drain of the fourth transistor being connected to a first potential, with a gate of the fourth transistor being connected to the voltage signal, wherein, when the third transistor is not conducted, the first source/drain of the fourth transistor outputs the bit information stored in the bit cell of the organic memory.

6. The digital sensing circuit as claimed in claim 5, wherein the sensing block circuit further comprises:
   a fifth transistor, with a first source/drain of the fifth transistor being connected to the third potential, with a gate of the fifth transistor being connected to the first source/drain of the fourth transistor; and
   a sixth transistor, with a first source/drain of the sixth transistor being connected to a second source/drain of the fifth transistor, with a second source/drain of the sixth transistor being connected to the first potential, with a gate of the sixth transistor being connected to the gate of the fifth transistor, wherein the type of the fifth transistor is different from that of the sixth transistor, and the first source/drain of the sixth transistor outputs the bit information stored in the bit cell of the organic memory.

7. The digital sensing circuit as claimed in claim 6, wherein the fifth transistor is a P-type transistor and the sixth transistor is an N-type transistor.

8. The digital sensing circuit as claimed in claim 7, the first potential is a ground potential, and the third potential is a power-source potential.

9. The digital sensing circuit as claimed in claim 1, wherein the sensing block circuit is further connected to a sample and hold circuit that is used to shape and output the bit information stored in the bit cell of the organic memory.

10. The digital sensing circuit as claimed in claim 1, wherein the organic memory is a non-volatile memory.

11. A digital sensing circuit used for sensing bit information stored in a bit cell of one of a phase-change memory and a magnetic memory, comprising:
   a current-to-voltage converter, having a current terminal, used to convert a conduction current flowing through the current terminal into a voltage signal according to the conduction current;
   a sensing block circuit, coupled to the current-to-voltage converter and used to receive the voltage signal, so as to buffer and output the bit information stored in the bit cell according to the voltage signal; and
   a reset block circuit coupled to the current-to-voltage converter, wherein the reset block circuit is used to reset the voltage signal according to a first switch signal; and
   wherein the current-to-voltage converter comprises:
      a first transistor, with a first source/drain of the first transistor being connected to the current terminal of the current-to-voltage converter, with a gate of the first transistor being connected to a second switch signal; and
   a capacitor, with a first terminal and a second terminal, wherein the first terminal is connected to a second source/drain of the first transistor; the second terminal is connected to a first potential; and the voltage signal is obtained via the first terminal;
   wherein the reset block circuit comprises:
      a second transistor, with a first source/drain of the second transistor being connected to the first terminal of the capacitor, with a second source/drain of the second transistor being connected to a second potential, with a gate of the second transistor being connected to the first switch signal, wherein, when the first transistor is conducted, the second transistor is not conducted; and when the first transistor is not conducted, the second transistor is conducted.

12. The digital sensing circuit as claimed in claim 11, wherein if the type of the first transistor is different from that of the second transistor, the first switch signal is the same as the second switch signal; if the type of the first transistor is different from that of the second transistor, the second switch signal is out of phase with the first switch signal.

13. The digital sensing circuit as claimed in claim 12, wherein the first switch signal and the second switch signal are a clock signal, and the digital sensing circuit utilizes the duty cycle of the clock signal to adjust the individual conducting time of the first transistor and the second transistor.

14. The digital sensing circuit as claimed in claim 11, wherein the first potential and the second potential both are ground potentials.

15. The digital sensing circuit as claimed in claim 11, wherein the sensing block circuit comprises:
   a third transistor, with a first source/drain of the third transistor being connected to a third potential, with a gate of the third transistor being connected to a third switch signal; and
   a fourth transistor, with a first source/drain of the fourth transistor being connected to a second source/drain of the third transistor, with a second source/drain of the fourth transistor being connected to a first potential, with a gate of the fourth transistor being connected to the voltage signal,
   wherein, when the third transistor is not conducted, the first source/drain of the fourth transistor outputs the bit information stored in the bit cell.

16. The digital sensing circuit as claimed in claim 15, wherein the sensing block circuit further comprises:
   a fifth transistor, with a first source/drain of the fifth transistor being connected to the third potential, with a gate of the fifth transistor being connected to the first source/drain of the fourth transistor; and
   a sixth transistor, with a first source/drain of the sixth transistor being connected to a second source/drain of the fifth transistor, with a second source/drain of the sixth transistor being connected to the first potential, with a gate of the sixth transistor being connected to the gate of the fifth transistor, wherein the type of the fifth transistor is different from that of the sixth transistor, and the first source/drain of the sixth transistor outputs the bit information stored in the bit cell.

17. The digital sensing circuit as claimed in claim 16, wherein the fifth transistor is a P-type transistor and the sixth transistor is an N-type transistor.

18. The digital sensing circuit as claimed in claim 17, the first potential is a ground potential and the third potential is a power-source potential.

19. The digital sensing circuit as claimed in claim 11, wherein the sensing block circuit is further connected to a sample and hold circuit that is used to shape and output the bit information stored in the bit cell.

* * * * *